US012622193B2

(12) United States Patent　　　(10) Patent No.:　US 12,622,193 B2

Kagawa　　　　　　　　　　　　　(45) Date of Patent:　　May 5, 2026

(54) SUBSTRATE PROCESSING METHOD AND SUBSTRATE PROCESSING APPARATUS

(71) Applicant: Tokyo Electron Limited, Tokyo (JP)

(72) Inventor: Koji Kagawa, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 213 days.

(21) Appl. No.: 18/685,668

(22) PCT Filed: Aug. 15, 2022

(86) PCT No.: PCT/JP2022/030867

§ 371 (c)(1),
(2) Date: Feb. 22, 2024

(87) PCT Pub. No.: WO2023/026887

PCT Pub. Date: Mar. 2, 2023

(65) Prior Publication Data

US 2025/0132164 A1　　Apr. 24, 2025

(30) Foreign Application Priority Data

Aug. 24, 2021　　(JP) ................................. 2021-136507

(51) Int. Cl.
　　*H01L 21/311* 　　(2006.01)
　　*C09K 13/08* 　　(2006.01)
　　*H01L 21/67* 　　(2006.01)

(52) U.S. Cl.
　　CPC ........ *H01L 21/31111* (2013.01); *C09K 13/08* (2013.01); *H01L 21/31144* (2013.01); *H01L 21/6708* (2013.01)

(58) Field of Classification Search
None
See application file for complete search history.

(56) References Cited

U.S. PATENT DOCUMENTS 9,453,190 B1 * 　9/2016 　Byron ................... H10F 77/703
10,668,497 B2 * 　6/2020 　Akizuki ................. H01L 21/67
(Continued)

FOREIGN PATENT DOCUMENTS

JP　　H07-115077　A　　5/1995
JP　　2002-353443　A　　12/2002
(Continued)

OTHER PUBLICATIONS

International Search Report of PCT/JP2022/030867 dated Oct. 18, 2022.

*Primary Examiner* — Binh X Tran
(74) *Attorney, Agent, or Firm* — Chrisman Gallo Tochtrop LLC

(57) ABSTRACT

A technique enabling wet etching of a first silicon oxide film with high selectivity with respect to a metal film and a second silicon oxide film is provided. A substrate processing method of wet-etching a substrate having a stacked structure including a metal film, a first silicon oxide film, and a second silicon oxide film having a moisture content lower than that of the first silicon oxide film is provided. The substrate processing method includes performing an etching while increasing etching selectivity of the first silicon oxide film with respect to the second silicon oxide film and the metal film by supplying an etching liquid, which is prepared by diluting sulfuric acid, hydrogen peroxide and hydrofluoric acid in an anhydrous organic solvent, to the substrate such that the metal film, the first silicon oxide film, and the second silicon oxide film are simultaneously exposed to the etching liquid.

20 Claims, 3 Drawing Sheets

(56) References Cited

U.S. PATENT DOCUMENTS

| | | | |
|---|---|---|---|
| 2004/0115909 A1* | 6/2004 | Lee | H01L 21/31133 |
| | | | 257/E21.228 |
| 2004/0163681 A1* | 8/2004 | Verhaverbeke | C11D 7/08 |
| | | | 134/28 |
| 2010/0075478 A1* | 3/2010 | Chang | H01L 21/31111 |
| | | | 257/E21.334 |
| 2010/0099258 A1 | 4/2010 | Hoh | |
| 2013/0255772 A1* | 10/2013 | Lachowicz | H10F 77/211 |
| | | | 438/71 |
| 2019/0027373 A1 | 1/2019 | Kwon et al. | |
| 2022/0282182 A1 | 9/2022 | Sugishima | |

FOREIGN PATENT DOCUMENTS

| | | |
|---|---|---|
| JP | 3974028 B2 | 6/2007 |
| JP | 2020-140984 A | 9/2020 |
| KR | 10-2010-0004648 A | 1/2010 |
| TW | 202111104 A | 3/2021 |
| TW | 202111108 A | 3/2021 |

* cited by examiner

HM
SIN
P
TEOS
SIN
BPSG
SIN
W

HM
SIN
TEOS
SIN
BPSG
SIN
W

HM
SIN

TEOS

SIN

BPSG

SIN
W

1

SUBSTRATE PROCESSING METHOD AND SUBSTRATE PROCESSING APPARATUS

CROSS-REFERENCE TO RELATED APPLICATIONS

This Application is a U.S. national phase application under 35 U.S.C. § 371 of PCT Application No. PCT/JP2022/030867 filed on Aug. 15, 2022, which claims the benefit of Japanese Patent Application No. 2021-136507 filed on Aug. 24, 2021, the entire disclosures of which are incorporated herein by reference.

TECHNICAL FIELD

The various aspects and embodiments described herein pertain generally to a substrate processing method and a substrate processing apparatus.

BACKGROUND

A manufacturing process of a semiconductor device includes a wet etching process of selectively etching multiple types of films formed on a substrate. Patent Document 1 discloses a method of wet-etching a substrate, which includes a $SiO_2$ thermal oxide film as a first insulating film and a SiN film (or a SiON film by a CVD method) as a second insulating film stacked on the first insulating film, by using a HF aqueous solution. In the disclosure of Patent Document 1, a HF concentration is increased to about 5% when it is required to increase etching selectivity of the $SiO_2$ film with respect to the SiN film, whereas the HF concentration is lowered when non-selective etching is required.

Patent Document 1: Japanese Patent No. 3,974,028

SUMMARY

In an exemplary embodiment, there is provided a substrate processing method of wet-etching a substrate having a stacked structure including a metal film, a first silicon oxide film, and a second silicon oxide film having a moisture content lower than that of the first silicon oxide film. The substrate processing method includes performing an etching while increasing etching selectivity of the first silicon oxide film with respect to the second silicon oxide film and the metal film by supplying an etching liquid, which is prepared by diluting sulfuric acid, hydrogen peroxide and hydrofluoric acid in an anhydrous organic solvent, to the substrate such that the metal film, the first silicon oxide film, and the second silicon oxide film are simultaneously exposed to the etching liquid.

2

Figure 5:
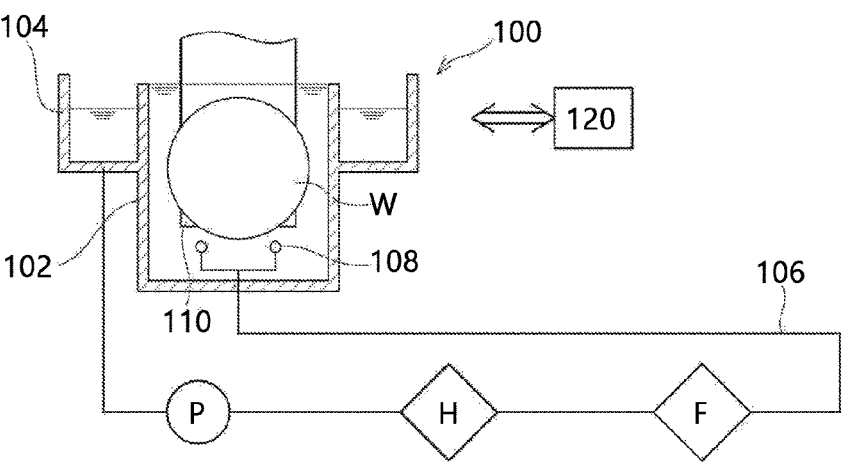

FIG. 5 is a schematic diagram illustrating another example substrate processing apparatus of performing the substrate processing method.

DETAILED DESCRIPTION

Figure 1:
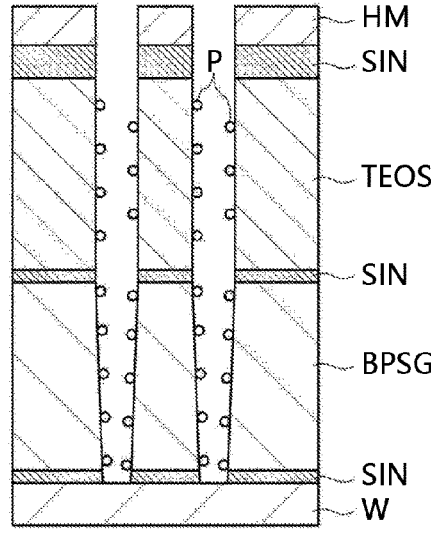
FIG. 1 is a schematic cross sectional view illustrating an example of a stacked film structure to be selectively wet-etched according to an exemplary embodiment of a substrate processing method.

FIG. 1 is a schematic cross sectional view showing a stacked structure as a target of a wet etching processing according to an exemplary embodiment of a substrate processing method of the present disclosure.

In the present exemplary embodiment, the wet etching processing is performed as a part of a capacitor shape correcting processing. A wet etching process is performed as a subsequent process to a dry etching process.

FIG. 1 illustrates a stacked structure as a target of wet etching. The stacked structure includes a tungsten film W, a silicon nitride (SiN) film, a boro-phospho silicate glass (BPSG) film as a first silicon oxide film, a silicon nitride (SiN) film, a tetraethoxy silane (TEOS) film as a second silicon oxide film, a silicon nitride (SiN) film, and a hard mask HM that are stacked in sequence from the bottom. This stacked structure is formed directly on a substrate (not shown) such as a silicon wafer, or is formed on the substrate with one or more other layers (films) interposed therebetween.

FIG. 1 shows a state immediately after a hole is formed by dry-etching a layer (film) above the tungsten film W by using the hard mask HM as an etching mask. Polymer P generated during the dry etching is attached to a surface of a trench.

Figure 2:
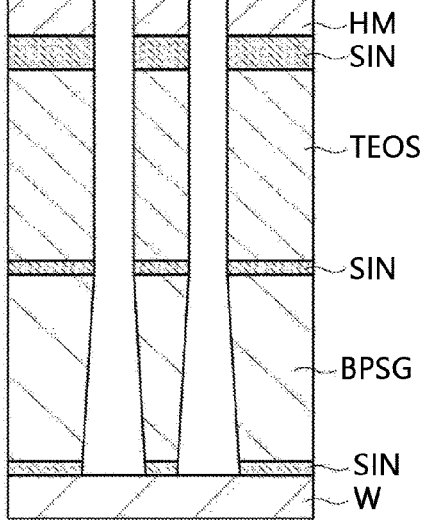
FIG. 2 is a schematic cross sectional view of a stacked structure, showing an example of a target etching result in the exemplary embodiment.
Figure 3:
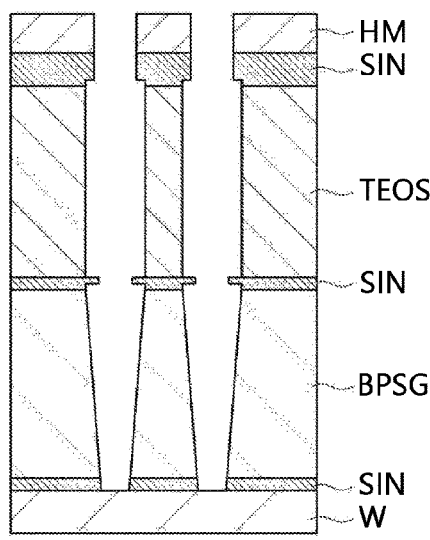
FIG. 3 is a schematic cross sectional view of a stacked structure, showing an example of an undesirable etching result.

In the wet etching according to the present exemplary embodiment, it is required to wet-etch the BPSG film from the state shown in FIG. 1, while suppressing etching of the W film and TEOS film, as illustrated in FIG. 2. It is not desirable that the TEOS film is deeply etched as schematically shown in FIG. 3. As a specific example, it is required to satisfy a condition of 'etching rate of BPSG/etching rate of TEOS>4' and a condition of 'etching rate of W film <10 Å/min'.

In addition, in the wet etching according to the present exemplary embodiment, it is also required to remove the polymer P generated in the previous dry etching process. Without being limited to the shown example, the polymer may adhere to a surface of an etching target object (a surface of the stacked structure (a top surface of the uppermost layer thereof) and an inner wall surface of a recess (hole or groove)).

In order to meet the aforementioned requirements, an etching liquid used in the present exemplary embodiment may have a composition as follows.

Sulfuric acid ($H_2SO_4$): 0.01 wt % to 15 wt %
Hydrogen peroxide ($H_2O_2$): 0.1 wt % to 10 wt %
Hydrofluoric acid (HF): 0.005 wt % to 1 wt %
The rest: An anhydrous organic solvent and moisture mainly derived from the raw materials (referring to stock solutions for preparing the etching liquid: the same applies hereinafter) (including a very small quantity of impurities that inevitably exist in the raw materials)

Desirably, the composition of the etching liquid may be as follows.

Sulfuric acid ($H_2SO_4$): 1 wt % to 15 wt %,
Hydrogen peroxide ($H_2O_2$): 0.2 wt % to 2 wt %,
Hydrofluoric acid (HF): 0.005 wt % to 0.5 wt %,
The rest: An anhydrous organic solvent and moisture mainly derived from raw materials (including a very small amount of impurities that inevitably exist in raw materials)

The content of the hydrofluoric acid (HF) is more desirably about 0.01 wt %.

In addition, the above-described composition of the etching liquid is calculated by a general calculation method. As a specific example, when the etching liquid contains 100 g of sulfuric acid having a concentration of 98%, it is calculated that the etching liquid contains 98 g of sulfuric acid and 2 g of water.

As can be understood from the above-specified composition, the main components of the etching liquid are sulfuric acid peroxide (SPM), which is a mixture of the sulfuric acid and the hydrogen peroxide and is effective in removing an organic substance, and the hydrofluoric acid (HF), which is effective in removing a silicon oxide film. Using a chemical liquid containing these main components in order to perform the wet-etching of the silicon oxide film and the removal of the polymer at the same time is well known in the art, so detailed description of the main components will be omitted here.

As the main components, ones having concentrations generally used in semiconductor device manufacture may be adopted. As a specific example, sulfuric acid ($H_2SO_4$) having a concentration of about 98 wt %, hydrogen peroxide ($H_2O_2$) having a concentration of about 31 wt % to 35 wt %, and hydrofluoric acid (HF) having a concentration of about 50 wt % may be used. These chemicals commonly used in the industry intentionally or unavoidably contain moisture for stabilization.

The present exemplary embodiment is characterized in that the anhydrous organic solvent is used instead of water generally used as a solvent in a wet etching liquid. By using the anhydrous organic solvent which does not substantially contain moisture as the solvent that occupies most of the composition of the etching liquid, moisture contained in the finally obtained etching liquid can be suppressed to a low level of, for example, less than 3% even when the aforementioned raw materials contain moisture. Effects obtained thereby will be described later.

The anhydrous organic solvent may be, by way of non-limiting example, $CH_3COOH$ (acetic acid), IPA (isopropyl alcohol), ethylene glycol, glycerin, or acetone. Among these, $CH_3COOH$ and ethylene glycol are regarded as being especially suitable.

The purity of the anhydrous organic solvent (which is mentioned in the above list) generally used in the semiconductor device manufacture is as follows.

$CH_3COOH$: >99.7%
IPA: >99.99%
Ethylene glycol: >99.5%
Glycerin: >99.0%
Acetone: >99.7%

In overall, it may be assumed that the moisture content of the anhydrous organic solvent mentioned in the list is less than 1 wt %.

The temperature of the etching liquid during the wet etching can be appropriately selected from a temperature range from a room temperature to about 80° C.

EXPERIMENTAL EXAMPLES

A test is performed to investigate the etching selectivity for the following two types of etching liquids.
<Etching Liquid 1>
$H_2SO_4$: 6.67 wt %
$H_2O_2$: 0.71 wt %
HF: 0.15 wt %
$CH_3COOH$: 90.22 wt %

The rest: Moisture (about 2.25 wt %)
<Etching Liquid 2>
Processed at 60° C.
$H_2SO_4$: 6.67 wt %
$H_2O_2$: 0.71 wt %
HF: 0.15 wt %
Ethylene glycol: 90.40 wt %
The rest: Moisture (about 2.07 wt %)
The following are used as test pieces.
(A) One having a BPSG film with a thickness of 6000 Å formed on a silicon wafer
(B) One having a TEOS film with a thickness of 3400 Å formed on a silicon wafer
(C) One having a SiO film with a thickness of 1000 Å formed on a silicon wafer, and a W film with a thickness of 300 Å on top of the SiO film A beaker is filled with the etching liquid, and the test pieces (A), (B), and (C) are immersed in the etching liquid for 30 seconds, 60 seconds, or 90 seconds. The temperature of the etching liquid 1 is set to the room temperature, and the temperature of the etching liquid 2 is set to 60° C. Thereafter, DIW rinsing is performed by immersing the test pieces in a beaker filled with DIW for 60 seconds. Then, the test pieces are dried by performing air blowing. The thicknesses of the BPSG film and the TEOS film before and after the etching are measured by using a spectroscopic ellipstometry method. In addition, the thickness of the W film before and after the etching is measured by using a four point probe technique.

A test result in the case of using the etching liquid 1 is shown in Table 1 below, and a test result in the case of using the etching liquid 2 is shown in Table 2 below.

TABLE 1

| <Etching liquid 1> | | | |
| --- | --- | --- | --- |
| Processing Time | BPSG/TEOS Selectivity | BPSG/W Selectivity | W Etching Amount (Å) |
| 30 sec | 17.5 | 41.7 | 0.87 |
| 60 sec | 19.2 | 52.0 | 1.23 |
| 90 sec | 19.5 | 46.2 | 2.02 |

TABLE 2

| <Etching liquid 2> | | | |
| --- | --- | --- | --- |
| Processing Time | BPSG/TEOS Selectivity | BPSG/W Selectivity | W Etching Amount (Å) |
| 30 sec | 12.2 | 8.8 | 0.92 |
| 60 sec | 12.8 | 6.5 | 1.97 |
| 90 sec | 14.2 | 5.1 | 3.55 |

As is apparent from Tables 1 and 2, the etching selectivity of the BPSG film with respect to the TEOS film is found to be in the range of 17.5 to 19.5 when using the etching liquid 1, and in the range of 12.2 to 14.2 when using the etching liquid 2. In any case, the etching selectivity significantly exceeds a target value of 4.

In addition, the etching rate of the W film is found to be about 1.23 Å/min when using the etching liquid 1, and about 1.97 Å/min when using the etching liquid 2, which are much smaller than a target value of 10 Å/min. In addition, although these etching rates are calculated based on data obtained when the processing time is 60 seconds, it is apparent that the etching rates are still smaller than 10 Å/min even when calculated based on data obtained when the processing time is 30 seconds or 90 seconds. Furthermore, the etching selectivity of the BPSG film with respect to the W film is found to be in the range of about 41.7 to about 52.0 when using the etching liquid 1, and in the range of about 5.1 to about 8.8 when using the etching liquid 2. In any case, the etching selectivity is found to be sufficiently high.

As can be clearly seen from the above-described test results, by using the etching liquid with the small moisture content in which the anhydrous organic solvent is used as a solvent, the etching selectivity of the BPSG film with respect to the TEOS film can be increased, and the etching rate of the W film can be reduced.

Regarding the above-described test results, the inventor of the present application assumes the following.

In order for a silicon oxide film to react with hydrogen fluoride, $HF_2^-$ needs to be generated through $H_2O$, as shown in the following expression.

$$2HF + H_2O \rightarrow HF_2^- + H_3O^+$$

$$SiO_2 + 2HF_2^- + 2H_3O^+ \rightarrow SiF_4 + 4H_2O$$

The moisture content of the silicon oxide film is in a relationship of BPSG>TEOS>Th-Ox.

If a sufficient amount of $H_2O$ is provided in the etching liquid (for example, when the solvent is water), a sufficient amount of $HF_2^-$ is generated regardless of the type of silicon oxide film, so there is no significant difference in the etching rate depending on the type of silicon oxide film.

Meanwhile, when the solvent of the etching liquid is the anhydrous organic solvent, as in the above-described exemplary embodiment, a sufficient amount of $HF_2^-$ is not generated in the etching liquid. In this case, $H_2O$ is supplied from the silicon oxide film. Accordingly, the etching rate of BPSG having a large moisture content increases, whereas the etching rate of TEOS having a small moisture content decreases. This is assumed to be the reason for the increase of the etching selectivity of the BPSG film with respect to the TEOS film.

It is assumed that etching of W occurs mainly according to the following expressions.

$$W + 2H_2O_2 \rightarrow WO_2 + 2H_2O$$

$$WO_2 \rightarrow W_2O_5 \rightarrow \ ... \ \rightarrow WO_3 \text{(progress of oxidation)}$$

$$WO_3 + H_2O \rightarrow H_2WO_4$$

$$H_2WO_4 + H_2O \rightarrow H_3O^+ + HWO_4-$$

As can be seen from the above expressions, the etching of W does not proceed under the condition that $H_2O_2$ and $H_2O$ are mostly absent. Therefore, in the above-described test in which the solvent of the etching liquid is the anhydrous organic solvent, it is assumed that the etching of W has not progressed mostly.

As is apparent from the above theory, a wet etching technique based on the above-described exemplary embodiment may be used in selective etching of two or more types of silicon oxide films having different moisture contents.

The above-described wet etching processing may be performed by any of a single-wafer type substrate processing apparatus and a batch type substrate processing apparatus.

Figure 4:
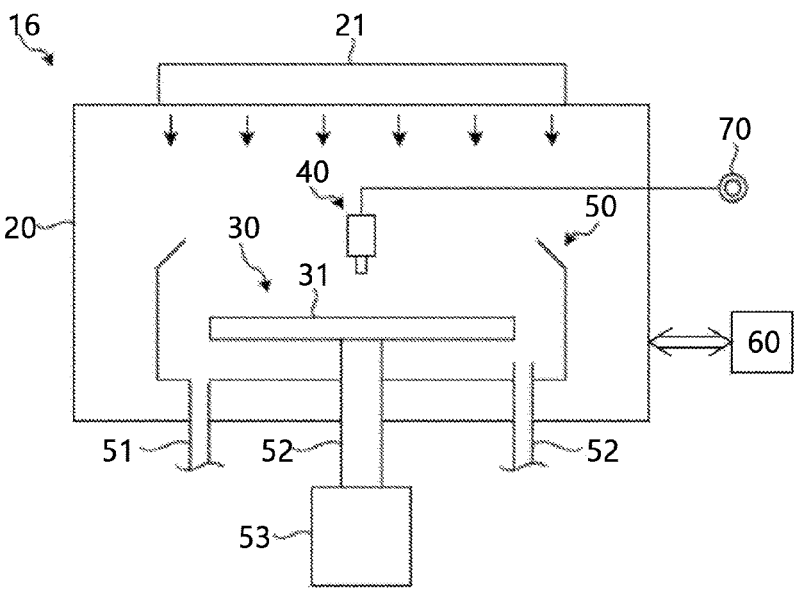
FIG. 4 is a schematic diagram illustrating an example substrate processing apparatus of performing a substrate processing method.

An example of the single-wafer type substrate processing apparatus is schematically shown in FIG. 4. A single-wafer type substrate processing apparatus 16 is equipped with a chamber 20. In the chamber 20, a substrate holding mechanism 30, at least one nozzle 40, and a liquid-receiving cup 50 are provided. The substrate holding mechanism 30 is equipped with a substrate holder 31, a rotation shaft 32, and a rotational driver 33. The substrate holder 31 is configured as a vacuum chuck or a mechanical chuck, and serves to hold the substrate in a horizontal posture. The rotational driver 33 is configured to rotate the substrate holder 31 and the substrate held thereby around a vertical axis with the rotation shaft 32 therebetween. A processing fluid source 70 is configured to supply a required processing liquid (processing fluid) to the nozzle 40. The liquid-receiving cup 50 collects the processing liquid scattered from the substrate being rotated. The processing liquid is drained from a drain port 51 formed at a bottom of the liquid-receiving cup 50 to the outside of the substrate processing apparatus 16. A clean gas is discharged downwards from a FFU 21 provided at a ceiling of the chamber 20. Meanwhile, the inside of the liquid-receiving cup 50 is suctioned through an exhaust port 52 formed at the bottom of the liquid-receiving cup 50, so that the clean gas is introduced into the liquid-receiving cup 50. Mist of the processing liquid scattered from the substrate is exhausted from the liquid-receiving cup 50 along the flow of the clean gas. A series of liquid processings on the substrate are performed as a controller 60 rotates the substrate held by the substrate holding mechanism 30 and supplies the required processing liquid such as the above-described etching liquid and a rinse liquid from the nozzle 40 to the substrate being rotated according to a preset processing recipe. A rinsing process may be performed in two stages including a first rinsing process and a second rinsing process. The first rinsing process may be performed by using the aforementioned anhydrous organic solvent, and the second rinsing process may be performed by using DIW.

An example of a batch type substrate processing apparatus will be described with reference to FIG. 5. The batch type substrate processing apparatus includes at least two batch type substrate processing devices 100 and a non-illustrated substrate transfer device configured to transfer a substrate between the at least two substrate processing devices 100. The substrate processing device 100 includes an inner tub 102 configured to store a processing liquid therein, and an outer tub 104 into which the processing liquid overflown from the inner tub 102 is introduced. One end of a circulation line 106 is connected to the outer tub 104. A nozzle 108 is provided in the inner tub 102, and the other end of the circulation line 106 is connected to the nozzle 108. The circulation line 106 is provided with a circulation pump P, a temperature controller such as a heater H, a particle filter F, and the like. After being flown from the inner tub 102, the processing liquid circulates to return to the inner tub 102 after passing through the outer tub 104, the circulation line 106, and the nozzle 108. As a plurality of substrates held in a vertical posture at an equal distance in a horizontal direction by a substrate holder 110 being moved in a vertical direction is immersed in the inner tub 102, an etching processing on the substrates is performed. A controller 120 is configured to operate the at least two batch type substrate processing devices 100 according to a preset processing recipe to carry out a series of liquid processings on the substrates. In this case, the etching processing using the above-described etching liquid is performed in one batch type substrate processing device 100, and a rinsing processing is performed in the other batch type substrate processing device 100.

The above-described controller 60 (120) is implemented by, for example, a computer, and the computer includes, by way of example, an operation processor and a storage. The storage stores therein a program for controlling various processings performed in the substrate processing apparatus (system). The operation processor controls an operation of the substrate processing apparatus by reading and executing the program stored in the storage. The program may be provided by being stored in a computer-readable recording medium. The computer-readable recording medium may be, by way of non-limiting example, a hard disk HD, a flexible disk FD, a compact disk CD, a magnet optical disk MO, or a memory card.

Here, it should be noted that the above-described exemplary embodiments are illustrative in all aspects and are not anyway limiting. The above-described exemplary embodiments may be omitted, replaced and modified in various ways without departing from the scope and the spirit of claims.

The substrate is not limited to the semiconductor wafer, and may be any of various types of substrates used in the manufacture of a semiconductor device, such as a glass substrate and a ceramic substrate.

According to the exemplary embodiment, it is possible to wet-etch the first silicon oxide film with high selectivity with respect to the metal film and the second silicon oxide film.

I claim:

1. A substrate processing method of wet-etching a substrate having a stacked structure including a metal film, a first silicon oxide film, and a second silicon oxide film having a moisture content lower than that of the first silicon oxide film, the substrate processing method comprising:

performing an etching while increasing etching selectivity of the first silicon oxide film with respect to the second silicon oxide film and the metal film by supplying an etching liquid, which is prepared by diluting sulfuric acid, hydrogen peroxide and hydrofluoric acid in an anhydrous organic solvent, to the substrate such that the metal film, the first silicon oxide film, and the second silicon oxide film are simultaneously exposed to the etching liquid.

2. The substrate processing method of claim 1, wherein the anhydrous organic solvent is acetic acid, isopropyl alcohol (IPA), ethylene glycol, glycerin, or acetone.

3. The substrate processing method of claim 1, wherein the anhydrous organic solvent is acetic acid or ethylene glycol.

4. The substrate processing method of claim 1, wherein the metal film is a tungsten film, the first silicon oxide film is boro-phospho silicate glass (BPSG), and the second silicon oxide film is tetraethoxy silane (TEOS).

5. The substrate processing method of claim 1, wherein polymer attached to a surface of the stacked structure exposed to the etching liquid is removed all at once by the etching liquid.

6. The substrate processing method of claim 1, wherein a temperature of the etching liquid is within a range from a room temperature to 80° C.

7. The substrate processing method of claim 1, wherein the etching selectivity of the first silicon oxide film with respect to the second silicon oxide film is larger than 4.

8. The substrate processing method of claim 1, wherein an etching rate of the metal film is less than 10 Å/min (angstrom per minute).

9. The substrate processing method of claim 1, wherein the etching liquid contains 0.01 wt % to 15 wt % of sulfuric acid, 0.1 wt % to 10 wt % of hydrogen peroxide, and 0.005 wt % to 1 wt % of hydrofluoric acid, and a rest of the etching liquid is composed of the anhydrous organic solvent, and moisture contained in stock solutions of the sulfuric acid, the hydrofluoric acid, and the hydrogen peroxide.

10. The substrate processing method of claim 1, wherein the etching liquid contains 1 wt % to 15 wt % of sulfuric acid, 0.2 wt % to 2 wt % of hydrogen peroxide, and 0.005 wt % to 0.5 wt % of hydrofluoric acid, and a rest of the etching liquid is composed of the anhydrous organic solvent, and moisture contained in stock solutions of the sulfuric acid, the hydrofluoric acid, and the hydrogen peroxide.

11. The substrate processing method of claim 1, wherein the stacked structure as a target of the wet-etching includes the metal film made of tungsten as a lowest layer, the first silicon oxide film made of boro-phospho silicate glass (BPSG) formed on the metal film, and the second silicon oxide film made of tetraethoxy silane (TEOS) formed on the first silicon oxide film, and the stacked structure is provided with a trench extending continuously in a stacking direction from a top of the stacked structure to a surface of the metal film.

12. The substrate processing method of claim 11, wherein the stacked structure includes a silicon nitride film between the metal film and the first silicon oxide film and between the first silicon oxide film and the second silicon oxide film.

13. The substrate processing method of claim 12, wherein the stacked structure includes a silicon nitride film provided directly on the second silicon oxide film and a hard mask layer provided directly on the silicon nitride film, the stacked structure has the trench formed by performing dry etching with the hard mask layer as an etching mask, polymer generated by the dry etching is attached to an inner wall surface of the trench, and the polymer is removed by the etching liquid.

14. The substrate processing method of claim 13, wherein the etching liquid contains 0.01 wt % to 15 wt % of sulfuric acid, 0.1 wt % to 10 wt % of hydrogen peroxide, and 0.005 wt % to 1 wt % of hydrofluoric acid, and a rest of the etching liquid is composed of the anhydrous organic solvent, and moisture contained in stock solutions of the sulfuric acid, the hydrofluoric acid, and the hydrogen peroxide.

15. The substrate processing method of claim 14, wherein the anhydrous organic solvent is acetic acid, isopropyl alcohol (IPA), ethylene glycol, glycerin, or acetone.

16. The substrate processing method of claim 14, wherein the anhydrous organic solvent is acetic acid or ethylene glycol.

17. The substrate processing method of claim 13, wherein the etching liquid contains 1 wt % to 15 wt % of sulfuric acid, 0.2 wt % to 2 wt % of hydrogen peroxide, and 0.005 wt % to 0.5 wt % of hydrofluoric acid, and a rest of the etching liquid is composed of the anhydrous organic solvent, and moisture contained in stock solutions of the sulfuric acid, the hydrofluoric acid, and the hydrogen peroxide.

18. The substrate processing method of claim 17, wherein the anhydrous organic solvent is acetic acid, isopropyl alcohol (IPA), ethylene glycol, glycerin, or acetone.

19. The substrate processing method of claim 17, wherein the anhydrous organic solvent is acetic acid or ethylene glycol.

20. A substrate processing apparatus, comprising:
a substrate holder configured to hold a substrate;
an etching liquid supply configured to supply an etching liquid to the substrate held by the substrate holder; and
a controller configured to perform a substrate processing method as claimed in claim 1 by controlling an operation of the substrate processing apparatus.

\* \* \* \* \*